United States Patent

Narita

(10) Patent No.: US 10,297,520 B2
(45) Date of Patent: May 21, 2019

(54) SEMICONDUCTOR DEVICE AND MANUFACTURING METHOD OF A SEMICONDUCTOR DEVICE

(71) Applicant: TOYOTA JIDOSHA KABUSHIKI KAISHA, Toyota-shi, Aichi-ken (JP)

(72) Inventor: Katsutoshi Narita, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/332,041

(22) Filed: Oct. 24, 2016

(65) Prior Publication Data

US 2017/0148700 A1 May 25, 2017

(30) Foreign Application Priority Data

Nov. 19, 2015 (JP) ................. 2015-227078

(51) Int. Cl.
| | | |
|---|---|---|
| *H01L 21/78* | (2006.01) | |
| *H01L 23/00* | (2006.01) | |
| *H01L 23/31* | (2006.01) | |
| *H01L 29/66* | (2006.01) | |
| *H01L 23/544* | (2006.01) | |

(Continued)

(52) U.S. Cl.
CPC .......... *H01L 23/3171* (2013.01); *H01L 21/78* (2013.01); *H01L 23/544* (2013.01); *H01L 29/417* (2013.01); *H01L 29/7397* (2013.01); *H01L 23/562* (2013.01); *H01L 29/66348* (2013.01); *H01L 2223/5442* (2013.01); *H01L 2223/5446* (2013.01); *H01L 2223/5448* (2013.01); *H01L 2223/54426* (2013.01);

(Continued)

(58) Field of Classification Search
CPC . H01L 2223/54426; H01L 2223/54493; H01L 2223/54453; H01L 2223/5446; H01L 2223/5448
See application file for complete search history.

(56) References Cited

U.S. PATENT DOCUMENTS

| | | | | |
|---|---|---|---|---|
| 4,981,529 A | * | 1/1991 | Tsujita | ................. G03F 9/7076 148/33 |
| 6,893,943 B2 | * | 5/2005 | Ohsumi | ................. H01L 23/544 257/620 |

(Continued)

FOREIGN PATENT DOCUMENTS

| | | |
|---|---|---|
| JP | 2000-040773 A | 2/2000 |
| JP | 2005-101181 A | 4/2005 |
| JP | 2014-126414 A | 7/2014 |

*Primary Examiner* — David A Zarneke
(74) *Attorney, Agent, or Firm* — Oliff PLC

(57) ABSTRACT

A manufacturing method of a semiconductor device includes: forming a mark on a surface of a semiconductor wafer, at least a part of the mark being disposed in a planned-peripheral region, the planned-peripheral region being located around a respective planned-element region where a semiconductor element is to be formed; forming the semiconductor element in the planned-element region using the mark; forming a film that extends across a range including the planned-element region or the planned-peripheral region in the surface so as to cover at least a part of the mark with the film, after forming the semiconductor element; and after forming the film, cutting the semiconductor wafer along a dicing region, the dicing region located around the planned-peripheral region.

5 Claims, 8 Drawing Sheets

(51) Int. Cl.
*H01L 29/417* (2006.01)
*H01L 29/739* (2006.01)

(52) U.S. Cl.
CPC ............... *H01L 2223/54453* (2013.01); *H01L 2223/54493* (2013.01)

(56) References Cited

U.S. PATENT DOCUMENTS

| | | | |
|---|---|---|---|
| 7,554,211 B2* | 6/2009 | Kida | H01L 21/78 257/618 |
| 8,822,141 B1* | 9/2014 | Farooq | H01L 23/544 430/314 |
| 8,987,922 B2* | 3/2015 | Yu | H01L 23/544 257/678 |
| 9,054,112 B2* | 9/2015 | Lehr | H01L 23/544 257/797 |
| 9,318,386 B2* | 4/2016 | Hu | H01L 21/78 |
| 9,682,539 B2* | 6/2017 | Thallner | H01L 24/05 |
| 2004/0207097 A1* | 10/2004 | Carpi | H01L 23/544 257/797 |
| 2004/0261282 A1* | 12/2004 | Bae | G03F 7/7085 33/645 |
| 2011/0304007 A1* | 12/2011 | Watanabe | H01L 21/78 257/506 |
| 2014/0264885 A1* | 9/2014 | Tsai | H01L 23/544 257/769 |
| 2017/0092523 A1* | 3/2017 | Yu | H01L 21/681 |

* cited by examiner

SEMICONDUCTOR DEVICE AND MANUFACTURING METHOD OF A SEMICONDUCTOR DEVICE

INCORPORATION BY REFERENCE

The disclosure of Japanese Patent Application No. 2015-227078 filed on Nov. 19, 2015 including the specification, drawings and abstract is incorporated herein by reference in its entirety.

BACKGROUND

1. Field of the Disclosure

The disclosure relates to a semiconductor device and a manufacturing method of a semiconductor device.

2. Description of Related Art

In manufacturing of semiconductor devices, after multiple semiconductor devices are integrally formed in a single semiconductor wafer, the semiconductor wafer is cut along a dicing region so as to separate the multiple semiconductor devices into individual pieces from the single semiconductor wafer. In usual, alignment marks and other marks are applied in a dicing region. The marks of this type are configured to be optically readable, and are used in a process of forming semiconductor elements in the single semiconductor wafer. For example, the alignment marks are marks used as a reference of positioning, and based on the positions of the read alignment marks, a processing device (e.g., an exposure mask) is positioned relative to the semiconductor wafer. In Japanese Patent Application Publication No. 2014-126414, there is described a manufacturing method of semiconductor devices using alignment marks.

SUMMARY

In dicing, a dicing blade is usually used. Cutting of a semiconductor wafer with a dicing blade might cause chipping and cracks to cut surfaces of the semiconductor wafer (i.e., outer peripheral surfaces of semiconductor substrates separated into individual pieces). In particular, if there exist marks in the dicing region, the dicing blade comes into contact with the marks, so that cut pieces of the marks might cause clogging to the dicing blade. Consequently, a high stress is applied to the semiconductor substrate in the vicinity of the marks, and cracks might be caused to the semiconductor substrate at this position. Such cracks of the semiconductor substrate are referred to as cracks resulting from the marks, hereinafter. Occurrence of the cracks resulting from the marks is likely to result in drop of the marks from the semiconductor substrate in subsequent processes, and the marks having dropped become large foreign matters, which might cause defects.

The disclosure provides a technique to prevent marks from coming off a semiconductor substrate in subsequent processes even if cracks resulting from the marks are caused in dicing, thereby preventing generation of large foreign matters due to the drop of the marks.

A first aspect of the present disclosure provides a manufacturing method of a semiconductor device. A manufacturing method of a semiconductor device, according to the first aspect includes: forming a mark on a surface of a semiconductor wafer, the mark including a material different from a material of the semiconductor wafer, at least a part of the mark being disposed in a range located in a planned-peripheral region in the surface, the planned-peripheral region being located around a respective planned-element region where a semiconductor element is to be formed; after forming the mark, forming the semiconductor element in the planned-element region using the mark; after forming the semiconductor, forming a film that extends across a range including the planned-element region or the planned-peripheral region in the surface so as to cover at least a part of the mark with the film; and after forming the film, cutting the semiconductor wafer along a dicing region, the dicing region located around the planned-peripheral region.

In the aforementioned manufacturing method, before the dicing, the marks are covered with a protective film or an electrode film. Accordingly, even if a crack resulting from the mark is caused in the dicing, this mark is retained by the protective film, thereby preventing the mark from coming off a semiconductor substrate. A crack is more unlikely to be caused to a resin material or a metallic material than to a semiconductor material configuring the semiconductor substrate. Accordingly, even if the crack resulting from the mark is caused to the semiconductor substrate, it is difficult to suppose that this crack progresses to the protective film or the metallic film, and comes off along with the protective film or the electrode film. Through this, even if the crack resulting from the mark is caused in the dicing, each mark is prevented from coming off the semiconductor substrate to become large foreign matters in subsequent processes.

In the first aspect, cutting the semiconductor wafer may include specifying a position at which the semiconductor element is disposed based on the mark.

In the first aspect, forming the film may include forming the film across the range extending from the planned-element region into the planned-peripheral region.

In the first aspect, the film may include at least one of a protective film formed of a resin material and an electrode film formed of a metallic material.

In the first aspect, in forming the film, at least the protective film may be formed.

In the above aspect, forming the film may include: forming a film of the resin material, the film of the resin material composing the protective film, across a range extending from the planned-element region, the planned-peripheral region through the dicing region in the surface of the semiconductor wafer; and removing a part of the film of the resin material located in the dicing region after the film of the resin material is formed.

In the first aspect, the resin material may be polyimide.

The manufacturing method according to the first aspect may include, before forming the mark, determining the planned-element region, the planned-peripheral region, and the dicing region in the semiconductor wafer.

A second aspect of the present disclosure provides a semiconductor device.

The semiconductor device according to the second aspect includes: a semiconductor substrate including an element region in which a semiconductor element is formed, and a peripheral region located around the element region; a mark disposed in a range located in the peripheral region in a surface of the semiconductor substrate, the mark including a material different from a material of the semiconductor substrate; and a film extending in a range including the peripheral region in the surface so as to cover at least a part of the mark.

In the semiconductor device according to the second aspect, each mark located in a peripheral region is covered with the protective film or the electrode film. According to this configuration, even if the crack resulting from the mark is caused to the semiconductor substrate in the dicing, the mark is prevented from coming off the semiconductor substrate. Through this, in a manufacturing process of a product using the semiconductor device, it is possible to prevent each mark from coming off the semiconductor substrate to become large foreign matters, for example.

In the second aspect, the film may be located across a range extending from the element region into the peripheral region in the surface.

In the second aspect, the film may be made of a resin material.

In the above aspect, the film may be made of polyimide.

In the second aspect, the film may be an electrode film made of a metallic material.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
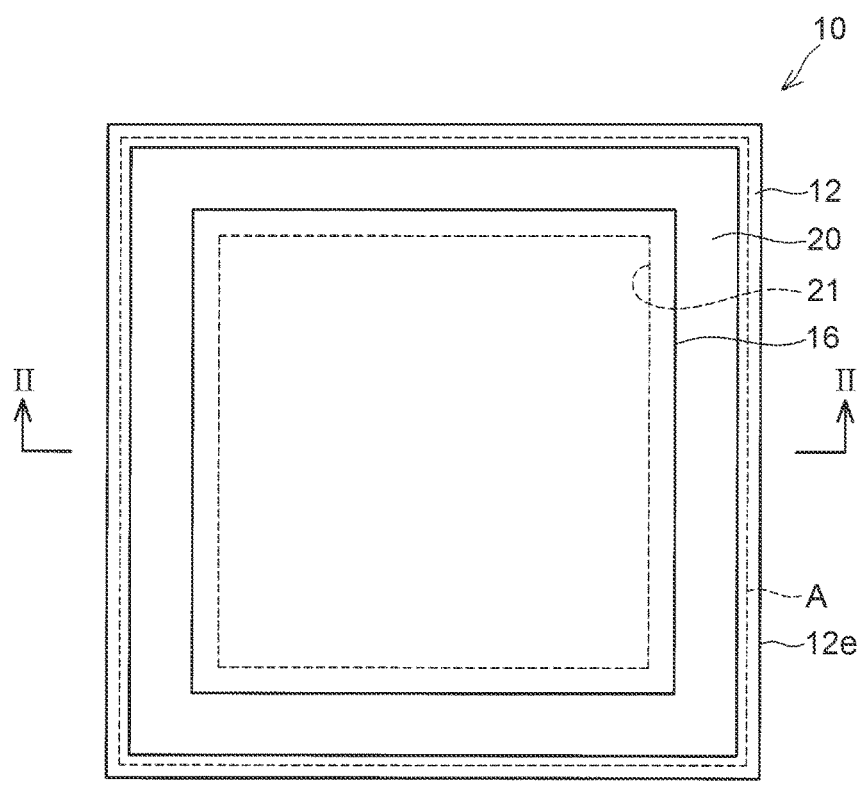
FIG. 1 is a plan view of a semiconductor device 10 of an embodiment.
Figure 2:
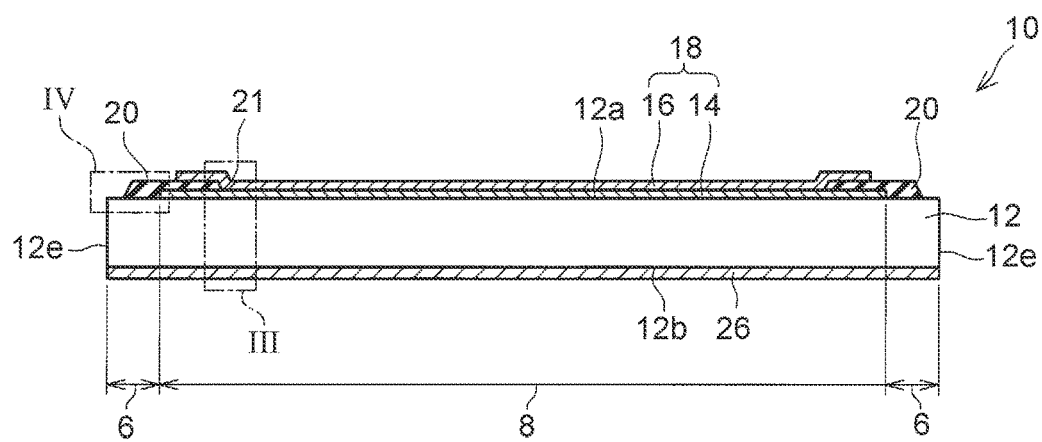
FIG. 2 is a sectional view taken along line II-II in FIG. 1.

With reference to drawings, a semiconductor device 10 of an embodiment will be described. The semiconductor device 10 is a type of a power semiconductor device, and is used for an electric power supply circuit through which current flows to a load such as a motor, for example. As shown in FIG. 1 and FIG. 2, the semiconductor device 10 includes a semiconductor substrate 12, an upper surface electrode 18, a protective film 20, and a lower surface electrode 26. The upper surface electrode 18 and the protective film 20 are located on an upper surface 12a (referred to as an upper substrate surface 12a, hereinafter) side of the semiconductor substrate 12. The lower surface electrode 26 is located on a lower surface 12b (referred to as a lower substrate surface 12b, hereinafter) side of the semiconductor substrate 12. Although not shown in the drawings, multiple signal pads including a gate pad are provided on the upper substrate surface 12a side. It should be noted that the upper substrate surface 12a and the lower substrate surface 12b are expressed in order to distinguish two surfaces on opposite sides in the semiconductor substrate 12 for convenience of explanation. Hence, the upper substrate surface 12a and the lower substrate surface 12b as referred to herein are not always become an upper surface and a lower surface of the semiconductor device 10 in the vertical direction when the semiconductor device 10 is used.

The semiconductor substrate 12 is a substrate including a semiconductor material, and may be configured by using silicon (Si) or silicon carbide (SiC). The semiconductor substrate 12 includes an element region 8 and a peripheral region 6. The element region 8 is a region where multiple semiconductor elements are formed, and mainly current flows between the upper surface electrode 18 and the lower surface electrode 26. In addition to the region where the current flows between the upper surface electrode 18 and the lower surface electrode 26 (main region), the element region 8 may also have an element breakdown-proof structure provided around the main region. The peripheral region 6 is a region located at a periphery of the element region 8, and located between the element region 8 and an outer peripheral surface 12e of the semiconductor substrate 12. A broken line A of FIG. 1 indicates a position of a boundary surface between the element region 8 and the peripheral region 6. The semiconductor elements formed in the element region 8 are not limited to particular types of semiconductor elements. These semiconductor elements may be power transistor elements or power diode elements, such as IGBTs (insulated gate bipolar transistors) and MOSFETs (metal-oxide-semiconductor field-effect transistors). The above semiconductor elements may also be combinations of power transistor elements and power diode elements, such as reverse conducting IGBTs, for example.

Figure 3:
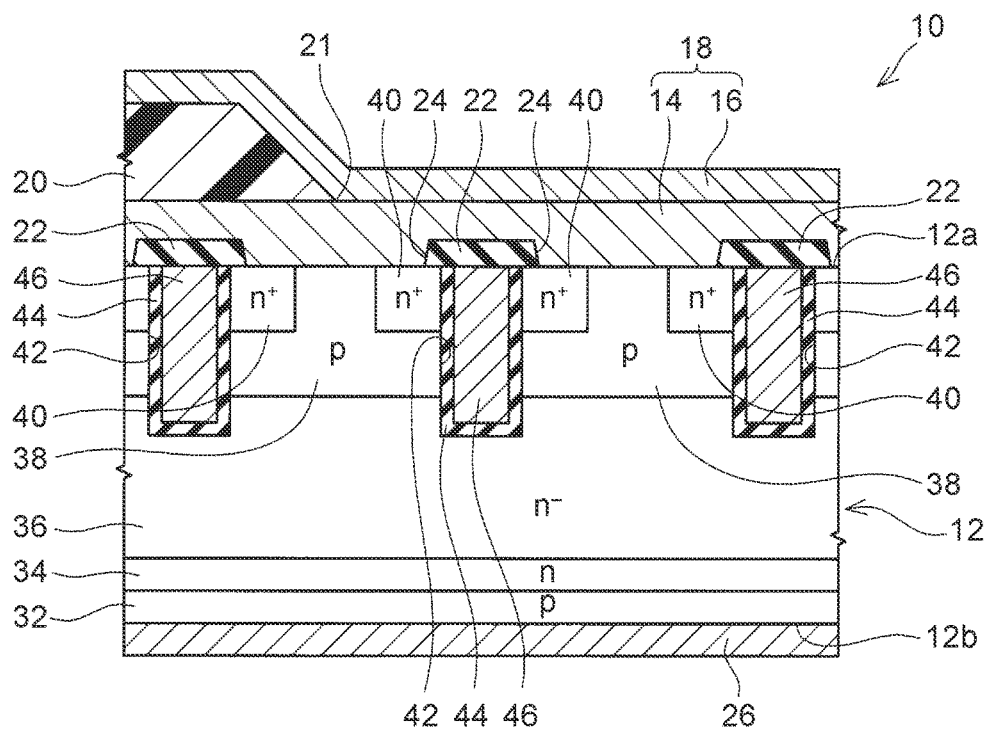
FIG. 3 is an enlarged view of a part III in FIG. 2.

As shown in FIG. 1 to FIG. 3, the upper surface electrode 18 includes a first electrode film 14 and a second electrode film 16. The first electrode film 14 is provided on the upper substrate surface 12a so as to be electrically connected to the element region 8. The first electrode film 14 may be configured by using a metallic material, and an example of the metallic material may include aluminum (Al), an aluminum alloy mainly containing aluminum, or the like. The second electrode film 16 may be configured by using a metallic material, and an example of the metallic material may include nickel (Ni), an alloy mainly containing nickel, or the like. The lower surface electrode 26 may be configured by using a metallic material, and an example of the metallic material may include an aluminum alloy or the like. As with the upper surface electrode 18, the lower surface electrode 26 may be covered with a metallic layer of nickel or others. The above description is merely an example, and the configurations of the upper surface electrode 18 and the lower surface electrode 26 may not be limited to particular configurations.

The protective film 20 includes a resin material (high molecular compound) having an electric insulation. The protective film 20 has a function of securing a breakdown-proof of the semiconductor device 10, and a function of protecting the semiconductor device 10 from a physical contact, for example. As an example, the protective film 20 of the present embodiment is configured by using polyimide. Polyimide has a more excellent heat resistance and a higher mechanical strength among resin materials, and thus polyimide is excellent as a material used for configuring the protective film 20. The protective film 20 is provided in a frame shape along a peripheral edge of the upper substrate surface 12a. Part (inner part) of the protective film 20 is located on the first electrode film 14, and an inner peripheral edge 21 of the protective film 20 defines an opening on the first electrode film 14. The first electrode film 14 is electrically connected to the second electrode film 16 through the opening defined by the inner peripheral edge 21 of the protective film 20. The protective film 20 is provided not only to the element region 8, but also in a range extending from the element region 8 into the peripheral region 6.

As shown in FIG. 3, in the semiconductor device 10 of the present embodiment, an IGBT is formed in the element region 8. With reference to FIG. 3, a structure of the element region 8 (i.e., structure of the IGBT) will be described. The structure described below is merely an example, and it is not intended to limit structures of the semiconductor elements formed in the element region 8. The element region 8 includes a collector region 32, a buffer region 34, a drift region 36, a body region 38, and an emitter region 40 in this order from the lower substrate surface 12b side toward the upper substrate surface 12a side. Multiple trenches 42 are formed in a stripe form in the upper substrate surface 12a in the element region 8, and gate electrodes 46 are disposed in the respective trenches 42.

The collector region 32 is a p-type region, and is exposed to the lower substrate surface 12b. The collector region 32 has a sufficiently high impurity concentration, and is electrically connected to the lower surface electrode 26. The buffer region 34 is an n-type region, and is located between the collector region 32 and the drift region 36. The drift region 36 is an n-type region, and is located between the buffer region 34 and the body region 38. The drift region 36 has a lower impurity concentration than an impurity concentration of the buffer region 34. The body region 38 is a p-type region, and is located between the upper substrate surface 12a and the drift region 36. The body region 38 has a lower impurity concentration than an impurity concentration of the collector region 32. The body region 38 is exposed to the upper substrate surface 12a, and an impurity concentration in an exposed surface portion thereof (also referred to as a contact region) is increased substantially as high as that of the collector region 32. Accordingly, the body region 38 is electrically connected to the upper surface electrode 18 on the upper substrate surface 12a. The emitter region 40 is an n-type region, and is exposed to the upper substrate surface 12a. The emitter region 40 is partitioned from the drift region 36 by the body region 38. The emitter region 40 has a higher impurity concentration than an impurity concentration of the drift region 36, and is electrically connected to the upper surface electrode 18 on the upper substrate surface 12a.

The gate electrodes 46 include an electric conductive material, and may include polysilicon, for example. A lower end of each trench 42 reaches the drift region 36. The respective trenches 42 extend in a vertical direction in the drawing of FIG. 3. A gate insulating film 44 is provided between an inner surface of each trench 42 and each gate electrode 46. The gate insulating film 44 is configured by using an electric insulating material, and may include silicon oxide (SiO2), for example. Each gate electrode 46 opposes the drift region 36, the body region 38, and the emitter region 40 via each gate insulating film 44.

Inter-layer insulating films 22 are provided on the upper substrate surface 12a. Each inter-layer insulating film 22 electrically insulates each gate electrode 46 from the upper surface electrode 18. Each inter-layer insulating film 22 is so provided as to be correspondent to an opening of each trench 42 in a manner as to cover each gate electrode 46, and define each contact hole 24. Each contact hole 24 is formed in a range where no inter-layer insulating film 22 exists, and exposes the upper substrate surface 12a located between the two adjacent trenches 42. Through this, the body region 38 and the emitter region 40 are electrically connected to the upper surface electrode 18 through each contact hole 24. As aforementioned, the element region 8 has a structure of an IGBT, and is capable of functioning as a normally-off type power transistor that supplies and cuts off current flowing from the lower surface electrode 26 toward the upper surface electrode 18.

Figure 4:
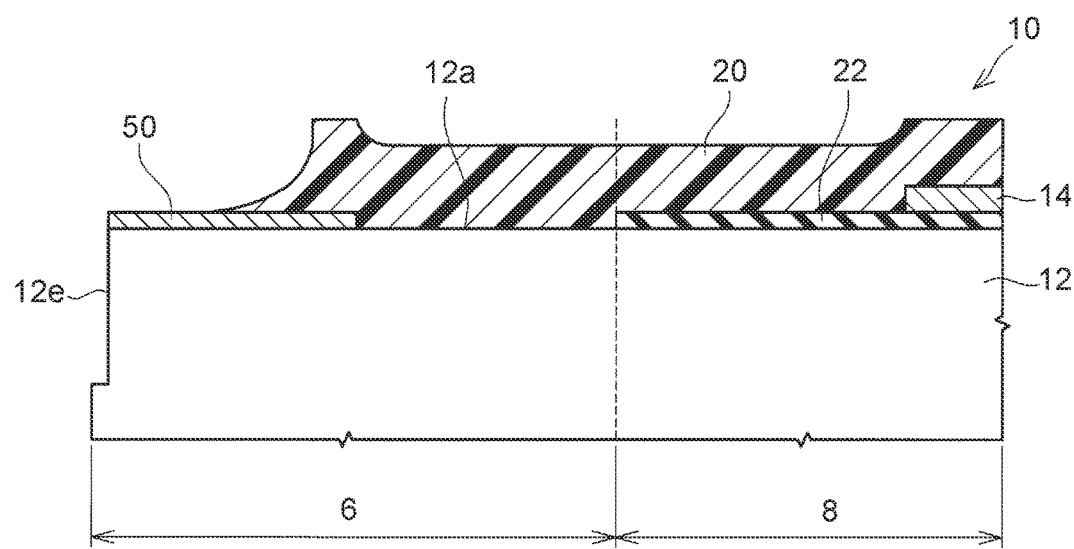
FIG. 4 is an enlarged view of a part IV in FIG. 2.
Figure 5:
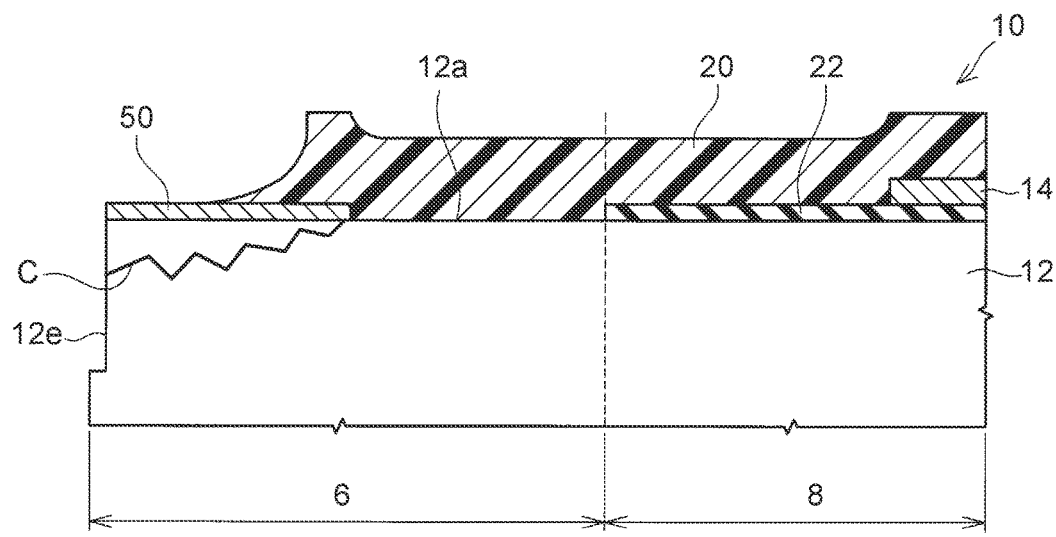
FIG. 5 is a drawing schematically showing that a large crack C is caused to a semiconductor substrate 12 of the semiconductor device 10.
Figure 6:
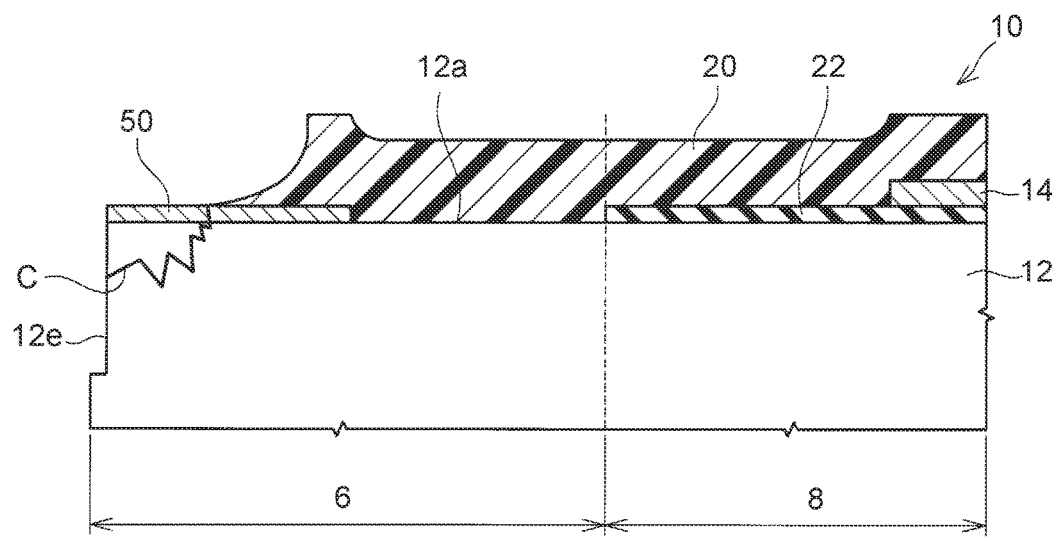
FIG. 6 is a drawing schematically showing that a small crack C is caused to a semiconductor substrate 12 of the semiconductor device 10.

With reference to FIG. 4, FIG. 5, and FIG. 6, the configuration of the peripheral region 6 of the semiconductor substrate 12 will be described. As shown in FIG. 4, there is provided at least one mark 50 on the upper substrate surface 12a in the peripheral region 6 of the semiconductor substrate 12. The mark 50 includes a material different from that of the semiconductor substrate 12. The mark 50 is configured to have at least one of specific shape, pattern, and color, and be optically readable. The mark 50 is an alignment mark, for example, and is read by optical equipment (e.g., a camera) in the manufacturing process of the semiconductor device 10, and a processing device (e.g., an exposure mask) is positioned relative to the semiconductor wafer based on the read position. The mark 50 is not limited to an alignment mark, and may include various marks used in the manufacturing process of the semiconductor device 10. The mark 50 is used in the manufacturing process of the semiconductor device 10, and has no particular function in the semiconductor device 10. Normally, multiple marks 50 may exist in the peripheral region 6 of the semiconductor substrate 12. The marks 50 remaining in the semiconductor device 10 may include some marks of which parts are damaged in a dicing process.

As shown in FIG. 4, a part of the mark 50 is covered with the protective film 20 extending from the element region 8. Specifically, the protective film 20 is located in a range extending from the element region 8 into the peripheral region 6 so as to cover the part of the mark 50. The protective film 20 may cover the entire mark 50. If multiple marks 50 are present in the semiconductor device 10, it may be configured to mix marks 50 entirely covered with the protective film 20 and marks 50 partially covered with the protective film 20 together. In addition, it is unnecessary to cover all the marks 50 with the protective film 20, and for example, some marks 50 located apart from the outer peripheral surface 12e of the semiconductor substrate 12 may not be covered with the protective film 20.

Figure 14:
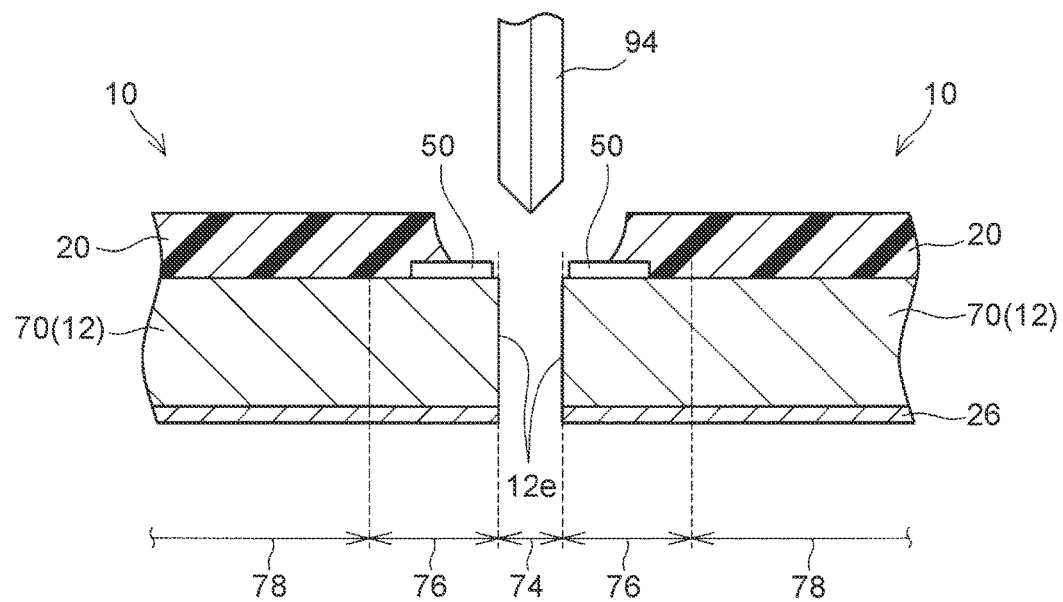
FIG. 14 is a drawing with respect to a dicing process, showing the semiconductor wafer 70 cut along the dicing region 74 (i.e., the semiconductor devices 10 separated into individual pieces)

Although described later in details, as shown in FIG. 14, in the manufacturing process of the semiconductor devices 10, a semiconductor wafer 70 in which multiple semiconductor devices 10 are integrally formed is cut into individual pieces in the dicing process. In the dicing process, a dicing blade 94 is usually used. The dicing blade 94 is a disk-shaped rotary blade, and has a structure in which abrasive grains, such as diamond abrasive grains, are bonded. In the dicing process, chipping or cracks might be caused to the outer peripheral surface 12e of the semiconductor substrate 12. In particular, if the mark 50 is present in the peripheral region 6, the dicing blade 94 comes into contact with the mark 50, and cut pieces of the mark 50 might cause clogging to the dicing blade 94. Consequently, as shown in FIG. 5 and FIG. 6, a high stress is caused to the semiconductor substrate 12 in the vicinity of the mark 50, so that a crack C might occur in the semiconductor substrate 12 at this position. Hereinafter, the crack C caused in the semiconductor substrate 12 in the vicinity of the mark 50 is referred to as a crack C resulting from the mark 50. If the crack C resulting from the mark 50 occurs, the mark 50 might come off the semiconductor substrate 12, and the dropped pieces might become large foreign matters to cause defects in subsequent processes.

To cope with the above problem, in the semiconductor device 10 of the present embodiment, at least a part of the mark 50 is covered with the protective film 20. Accordingly, as shown in FIG. 5, even if the crack C resulting from the mark 50 occurs, the mark 50 is retained by the protective film 20, thereby preventing the mark 50 from coming off the semiconductor substrate 12. In particular, the protective film 20 includes a resin material, and thus the protective film 20 is more unlikely to cause a crack compared with the semiconductor substrate 12. This can be attributed to some factors, such as an excellent toughness of a resin material than that of a semiconductor material. Hence, even if the crack C is caused in the semiconductor substrate 12, it is difficult to suppose that this crack C progresses to the protective film 20, and the mark 50 comes off along with the protective film 20. In particular, the protective film 20 of the present embodiment includes polyimide, which has a high mechanical strength (tensile strength). Accordingly, it is further difficult to suppose that the crack C progresses to the protective film 20. As shown in FIG. 6, if the crack C resulting from the mark 50 is relatively small, a part of the mark 50 that is not covered with the protective film 20 might come off the semiconductor substrate 12. However, compared with the case in which the entire mark 50 comes off, only a small foreign matter is generated, which causes only a small influence to the subsequent processes.

Figure 7:
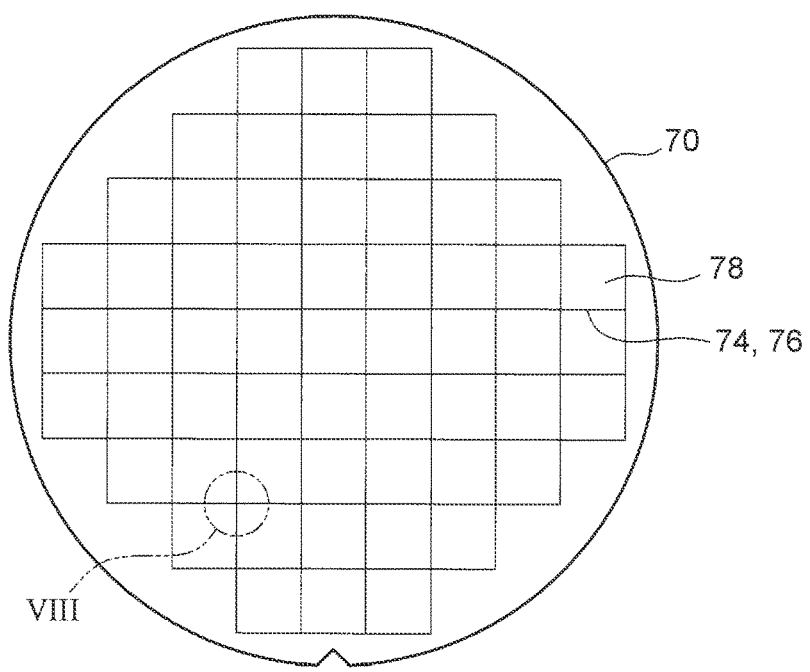
FIG. 7 is a drawing with respect to a determined process, schematically showing planned-element regions 78, planned-peripheral regions 76, and a dicing region 74 that are determined in a semiconductor wafer 70, and showing less planned-element regions 78 than actual ones for clarification of illustration.
Figure 8:
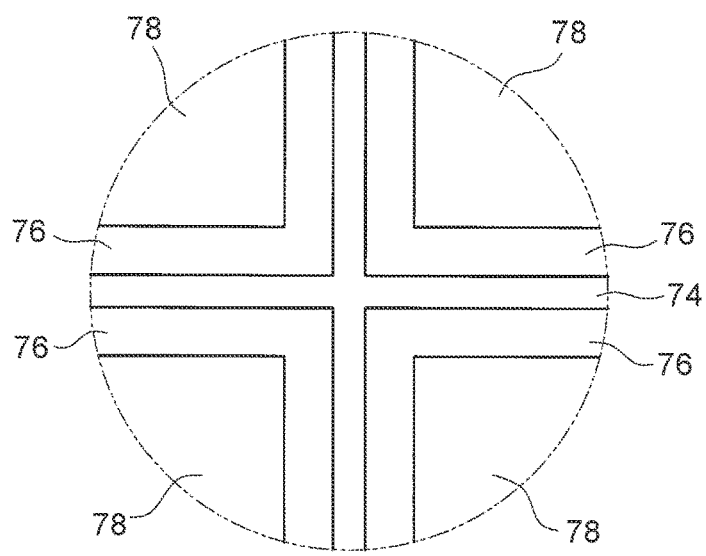
FIG. 8 is an enlarged view of a part VIII in FIG. 7.

With reference to FIG. 7 to FIG. 14, the manufacturing method of the semiconductor devices 10 will be described. In the following description, only major processes and treatments will be explained. Hence, the manufacturing method of the semiconductor devices 10 may include one or plural processes that will not be described in the following description if necessary. First, a determining process is carried out. In this determining process, as shown in FIG. 7 and FIG. 8, planned-element regions 78, planned-peripheral regions 76, and a dicing region 74 are determined in the semiconductor wafer 70 used in the manufacturing of the semiconductor devices 10. Each planned-element region 78 is a region to be the element region 8 of each semiconductor device 10, and the semiconductor elements are formed therein later. Each planned-peripheral region 76 is a region to be the peripheral region 6 of each semiconductor device 10, and the mark or marks 50 are provided therein later. The dicing region 74 is a region that is to be cut off in the subsequent dicing process, and does not exist any longer in each semiconductor device 10 that is a finished product. Each planned-peripheral region 76 is located around each planned-element region 78, and the dicing region 74 is located around each planned-peripheral region 76. This means that the dicing region 74 is located outward of each planned-peripheral region 76. The dicing region 74 is a region extending in a grid form, and the planned-element region 78 and the planned-peripheral region 76 are both located in each individual area partitioned by the dicing region 74.

Figure 9:
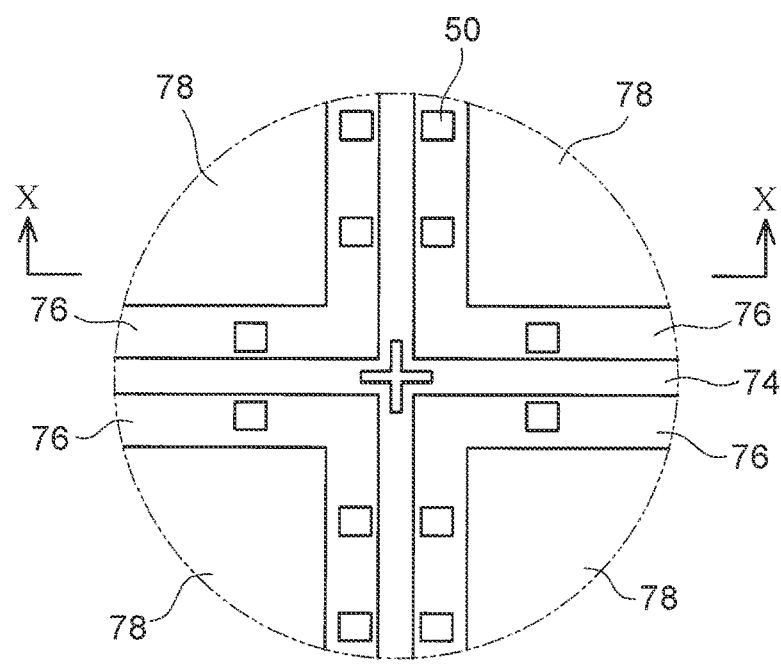
FIG. 9 is a drawing with respect to a mark forming process, showing marks 50 formed in the planned-peripheral regions 76 of the semiconductor wafer 70.
Figure 10:
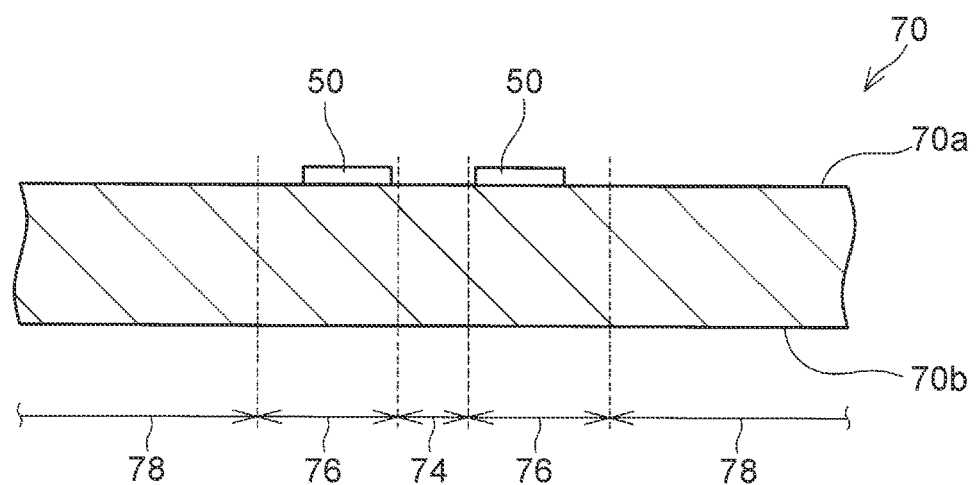
FIG. 10 is a sectional view taken along line X-X in FIG. 9.

Subsequently, the semiconductor wafer 70 is prepared, and a mark forming process is carried out. In this mark forming process, as shown in FIG. 9 and FIG. 10, one or multiple marks 50 are formed on an upper surface 70a of the semiconductor wafer 70. The marks 50 are formed in each planned-peripheral region 76. Each mark 50 may have various shapes, patterns, and colors depending on its purpose. The method of forming the marks 50 is not limited to particular one. Although a material configuring each mark 50 is not limited to particular one, a material such as a metallic material, which is different from a material configuring the semiconductor wafer 70, may be used, for example. A part of the mark 50 may be disposed in the dicing region 74. One or multiple marks 50 may also be disposed on the upper surface 70a located in the dicing region 74 if necessary. Although not shown in the drawing, alignment marks and others may also be applied on a lower surface 70b of the semiconductor wafer 70 if necessary.

Figure 11:
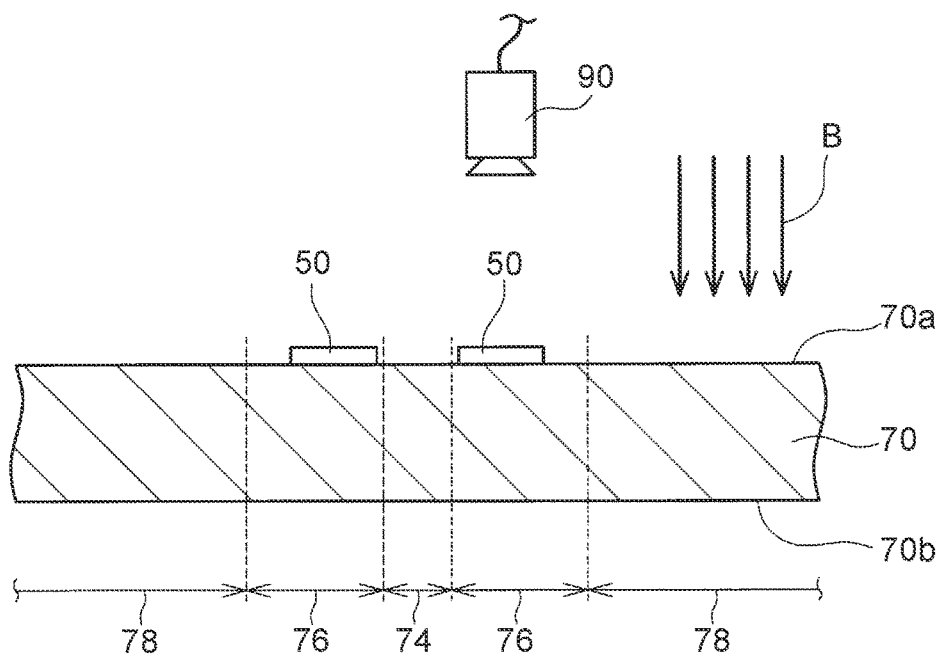
FIG. 11 is a drawing with respect to an element forming process, schematically showing that the marks 50 are read out, and semiconductor elements are formed in the planned-element region 78.

Subsequently, an element forming process is carried out. In this element forming process, as shown in FIG. 11, the semiconductor elements are formed in each planned-element region 78 of the semiconductor wafer 70 (see FIG. 3). In this process of forming the semiconductor elements, an ion implantation to introduce conductive impurities into each planned-element region 78, an annealing treatment to activate the conductive impurities in the semiconductor wafer 70, a treatment to form an inter-layer insulating film 22 on the upper surface 70a of the semiconductor wafer 70, and others are carried out. In the element forming process, various treatments are carried out while one or multiple marks 50 are read out by an optical apparatus 90. For example, in the ion implantation, the multiple marks 50 (alignment marks) are read out, and positioning of an exposure mask and others are carried out based on the positions of the marks 50. A group of arrows B as shown in FIG. 11 schematically indicates various treatments applied to each planned-element region 78, and is not intended to show a particular treatment. Subsequently, the first electrode film 14 is formed on the upper surface 70a of the semiconductor wafer 70.

Figure 12:
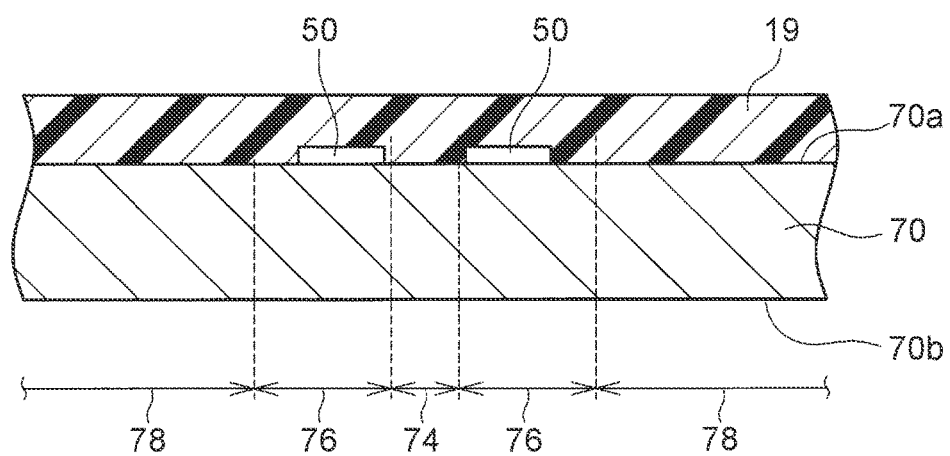
FIG. 12 is a drawing with respect to a film-forming process, showing a film 19 of a protective-film material formed on an upper surface 70a of the semiconductor wafer 70.

Subsequently, a film forming process is carried out. In this film forming process, as shown in FIG. 12, a film 19 of a resin material configuring the protective film 20 (referred to as a protective material film 19, hereinafter) is formed on the upper surface 70a of the semiconductor wafer 70. Specifically, in the present embodiment, the protective material film 19 is formed by using polyimide. The protective material film 19 is formed across a range extending from the planned-element regions 78, the planned-peripheral regions 76 through the dicing region 74. Through this, all the marks 50 are entirely covered with the protective material film 19. In this step, all the marks 50 have fulfilled their role, and no marks 50 will be subsequently used.

Figure 13:
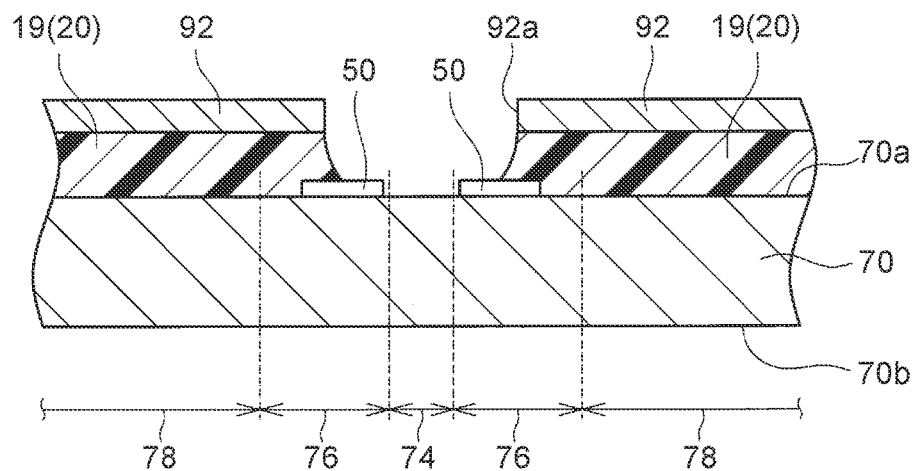
FIG. 13 is a drawing with respect to a removing process, showing the film 19 of the protective-film material (i.e., a formed protective film 20) of which part located on the dicing region 74 is removed.

A removing process is then carried out. In this removing process, as shown in FIG. 13, parts of the protective material film 19 located on the dicing region 74 are removed. A method of carrying out the removing process is not limited to particular one. As an example, a mask 92 having openings 92a on the dicing region 74 is formed, and wet-etching is then carried out, thereby selectively removing the parts of the protective material film 19 located on the dicing region 74. At this time, a part of the protective material film 19 located on each planned-peripheral region 76 may also be removed, but at least a part of each mark 50 is still maintained to be covered with the protective material film 19. In this removing process, a part of the protective material film 19 located on each planned-element region 78 is also removed, thereby forming the protective film 20 in a frame shape having each inner peripheral edge 21. Specifically, the film-forming process and the removing process configure a protective-film forming process to form the protective film 20 of each semiconductor device 10. Subsequently, a process of forming the second electrode film 16 of the upper surface electrode 18 and the lower surface electrode 26 is carried out.

Subsequently, the dicing process is carried out. As shown in FIG. 14, the semiconductor wafer 70 is cut along the dicing region 74 so as to be separated into individual pieces that are the multiple semiconductor devices 10. As aforementioned, in this dicing process, the dicing blade 94 is used, and the crack C resulting from the mark 50 might be caused to the outer peripheral surface 12e of the semiconductor substrate 12 (see FIG. 5, FIG. 6). However, at least a part of the mark 50 is covered with the protective film 20. Hence, even if the crack C resulting from the mark 50 occurs, the mark 50 is retained by the protective film 20; therefore, the mark 50 is prevented from coming off the semiconductor substrate 12 in the subsequent processes.

In the above manufacturing method, after the semiconductor elements are formed by using the marks 50, the marks 50 are covered with the protective film 20. Specifically, at the time when the marks 50 are covered with the protective film 20, the marks 50 have fulfilled their role. Accordingly, even if the marks 50 are covered with the protective film 20, no further inconvenience is caused because of this covering.

In the aforementioned manufacturing method, the marks 50 are covered with the protective film 20 that is a configuration component of each semiconductor device 10. Specifically, no additional component is required to cover the marks 50. Hence, compared with conventional manufacturing methods, it is only necessary to change the range of forming the protective film 20, thus avoiding complication of the manufacturing process of the semiconductor devices 10.

In the aforementioned manufacturing method, at least a part of each mark 50 is disposed in each planned-peripheral region 76 located between each planned-element region 78 and the dicing region 74. Accordingly, it is possible to cover at least a part of each mark 50 with the protective film 20 without having the protective film 20 on the dicing region 74. Through this, it is possible to prevent the dicing blade 94 from coming into contact with the protective film 20 in the dicing process. It might be supposed that if the dicing blade 94 comes into contact with the protective film 20, clogging is caused to the dicing blade 94, so that dicing performance becomes deteriorated (for example, chipping and the crack C frequently occur). However, according to the aforementioned manufacturing method, it is possible to avoid such a problem.

As aforementioned, the specific examples have been explained in details, and these examples are merely exemplifications, and they are not intended to limit the technique disclosed in the present specification. For example, it is unnecessary to dispose the protective film 20 in the range extending from each planned-element region 78 into each planned-peripheral region 76 as long as each mark 50 is prevented from coming off the semiconductor substrate 12. In other words, the protective film 20 may be disposed only in the range of one of the planned-element region 78 and the planned-peripheral region 76.

Figure 15:
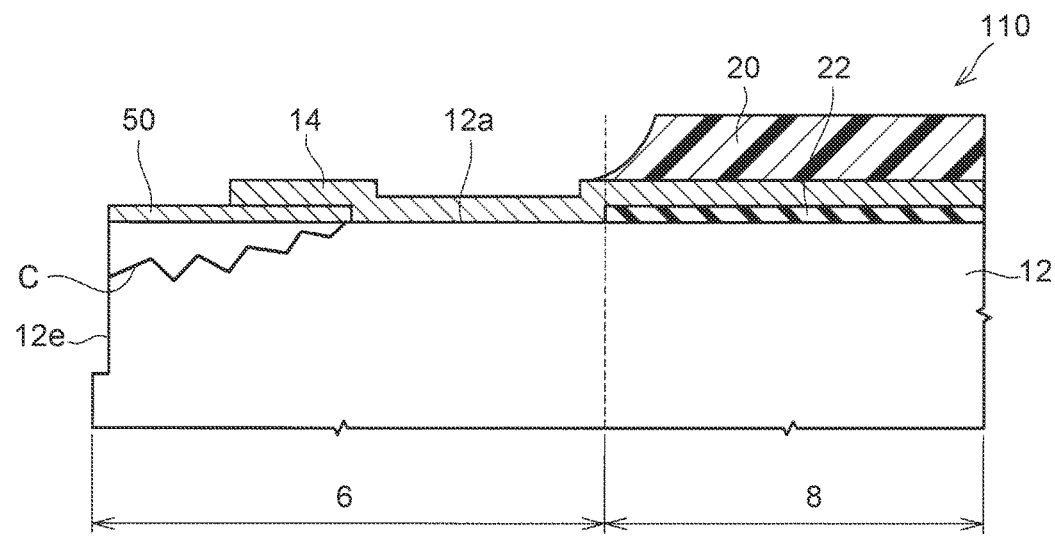
FIG. 15 is a drawing showing a major part of a semiconductor device 110 of another embodiment.

As shown in FIG. 15, in a semiconductor device 110 of another embodiment, at least a part of each mark 50 located in the peripheral region 6 may be covered with the first electrode film 14 instead of the protective film 20. The first electrode film 14 is located across the range extending from the element region 8 into the peripheral region 6 in the upper substrate surface 12a of the semiconductor substrate 12 so as to cover at least a part of each mark 50. Since the first electrode film 14 includes a metallic material, cracks are more unlikely to be caused compared with the semiconductor substrate 12. This can be attributed to some factors, such as an excellent toughness of metallic materials than toughness of semiconductor materials. In this manufacturing method of the semiconductor device 10, the first electrode film 14 is formed across the range extending from the planned-element regions 78 into the planned-peripheral regions 76 in the upper surface 70a of the semiconductor wafer 70 so as to cover at least a part of each mark 50. Furthermore, in another embodiment, at least a part of each mark 50 located in the peripheral region 6 may be covered with the second electrode film 16 or another electrode film that extends from the element region 8 instead of the protective film 20 or the first electrode film 14. By covering at least a part of each mark 50 with a configuration component of the semiconductor device 110, it is possible to prevent the mark 50 from coming off without complicating the structure of the semiconductor device 110 and the manufacturing method thereof. The configuration of the semiconductor device 110 may be applicable to a semiconductor device having no protective film 20.

Figure 16:
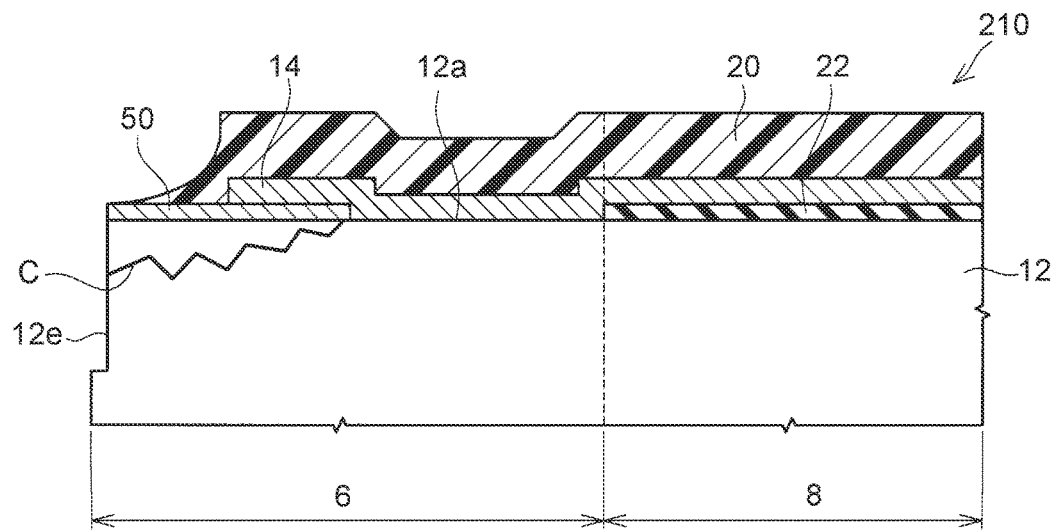
FIG. 16 is a drawing showing a major part of a semiconductor device 210 of another embodiment.

As shown in FIG. 16, in a semiconductor device 210 of another embodiment, at least a part of each mark 50 located in the peripheral region 6 may be covered with both the first electrode film 14 and the protective film 20. In this semiconductor device 210, both the first electrode film 14 and the protective film 20 are located across the range extending from the element region 8 into the peripheral region 6 in the upper substrate surface 12a of the semiconductor substrate 12, and both these films cover at least a part of each mark 50. In this manufacturing method of the semiconductor devices 210, the first electrode film 14 and the protective film 20 are both disposed across the range extending from the planned-element regions 78 into the planned-peripheral regions 76 in the upper surface 70a of the semiconductor wafer 70 so as to cover at least a part of each mark 50. In further another embodiment, at least a part of each mark 50 located in each peripheral region 6 may be covered with both the second electrode film 16 or another electrode film that extends from the element region 8 and the protective film 20.

Technical features that can be grasped from the disclosed contents of the present specification will be listed, hereinafter. The technical features described below are respective independent technical features, which exert technical usefulness independently or through various combinations thereof.

The manufacturing method of the semiconductor devices 10 disclosed in the present specification includes: the determining process of determining the planned-element regions 78, the planned-peripheral regions 76 located around the planned-element regions 78, and the dicing region 74 located around the planned-peripheral regions 76 in the semiconductor wafer 70; the mark forming process of forming the marks 50 in the range located in the planned-peripheral regions 76 in the upper surface 70a of the semiconductor wafer 70 after the determining process, the marks 50 including a different material than that of the semiconductor wafer 70; the element forming process of forming the semiconductor elements in the respective planned-element regions 78 using the marks 50 after the mark forming process; the film forming process of forming at least one of the protective film 20 including a resin material and the electrode film 14, 16 including a metallic material in a manner as to be located across the range extending from the planned-element regions 78 into the planned-peripheral regions 76 in the upper surface 70a of the semiconductor wafer 70 so as to cover at least a part of each mark 50 after the element forming process; and the dicing process of cutting the semiconductor wafer 70 along the dicing region 74 after the film forming process.

In the aforementioned manufacturing method, in the film forming process, it is preferable to form at least the protective film 20. According to this configuration, it is possible to manufacture the semiconductor devices 10, each having the peripheral region 6 of the semiconductor substrate 12 protected by the protective film 20 having an electric insulation property.

In the aforementioned manufacturing method, the film forming process may include: the film forming process of forming the film 19 of the resin material configuring the protective film 20 across the range extending from the planned-element regions 78, the planned-peripheral regions 76 through the dicing region 74 in the upper surface 70a of the semiconductor wafer 70; and the removing process of removing parts of the film 19 of the resin material located on the dicing region 74 after the film forming process. According to this configuration, no protective film 20 is present in the dicing region 74 in the dicing process, and thus it is possible to avoid clogging of the dicing blade 94 due to contact between the dicing blade 94 and the protective film 20, and prevent deterioration of dicing performance resulting from this clogging.

In the aforementioned manufacturing method, the resin material configuring the protective film 20 may be polyimide. Polyimide has a higher mechanical strength (tensile strength) compared with other resin materials. Accordingly, even if the crack C resulting from the mark 50 is caused, progression of this crack C to the protective film 20 is further suppressed, thus more securely preventing the mark from coming off in the subsequent processes.

What is claimed is:

1. A manufacturing method of a semiconductor device, the manufacturing method comprising:
   (a) forming a mark on a surface of a semiconductor wafer, the mark including a material different from a material of the semiconductor wafer, at least a part of the mark being disposed in a range located in a planned-peripheral region in the surface, the planned-peripheral region being located around a respective planned-element region where a semiconductor element is to be formed;
   (b) after the step (a), forming the semiconductor element in the planned-element region using the mark;
   (c) after the step (b), forming a film that extends across a range including the planned-element region or the planned-peripheral region in the surface so as to cover at least a portion of the mark with the film; and
   (d) after the step (c), cutting the semiconductor wafer along a dicing region while at least part of the mark is covered with the film, the dicing region being located around the planned-peripheral region, wherein
   the film includes at least one of a protective film formed of a resin material and an electrode film formed of a metallic material,
   in the step (c), at least the protective film is formed, and the step (c) includes:
      forming the protective film formed of the resin material across a range extending from the planned-element region through the planned-peripheral region and through the dicing region in the surface of the semiconductor wafer; and
      removing a part of the protective film located in the dicing region and a part of the protective film located on the planned-element region after the protective film is formed.

2. The manufacturing method according to claim 1, wherein
   the step (d) includes specifying a position at which the semiconductor element is disposed based on the mark.

3. The manufacturing method according to claim 1, wherein
   the step (c) includes forming the film across the range extending from the planned-element region into the planned-peripheral region.

4. The manufacturing method according to claim 1, wherein
   the resin material is polyimide.

5. The manufacturing method according to claim 1, further comprising:
   (e) before the step (a), determining the planned-element region, the planned-peripheral region, and the dicing region in the semiconductor wafer.

* * * * *